United States Patent [19]
Patel et al.

[11] Patent Number: 5,374,578
[45] Date of Patent: Dec. 20, 1994

[54] OZONE GAS PROCESSING FOR FERROELECTRIC MEMORY CIRCUITS

[75] Inventors: Divyesh N. Patel; Douglas Sheldon, both of Colorado Springs, Colo.

[73] Assignee: Ramtron International Corporation, Colorado Springs, Colo.

[21] Appl. No.: 64,746

[22] Filed: May 19, 1993

Related U.S. Application Data

[63] Continuation of Ser. No. 841,370, Feb. 25, 1992, abandoned.

[51] Int. Cl.⁵ .......................................... H01L 21/70
[52] U.S. Cl. ........................................ 437/52; 437/47; 437/60; 437/247; 148/DIG. 3
[58] Field of Search .................. 437/47, 48, 52, 60, 437/247, 919; 365/145, 149; 148/DIG. 3, DIG. 4, DIG. 14, DIG. 43; 257/295

[56] References Cited

U.S. PATENT DOCUMENTS

| 4,589,056 | 5/1986 | Stimmell | 361/311 |
| 5,043,049 | 8/1991 | Takenaka | 204/192.15 |
| 5,075,246 | 12/1991 | Re et al. | 437/47 |
| 5,138,520 | 8/1992 | McMillan et al. | 361/311 |
| 5,142,437 | 8/1992 | Kammerdiner et al. | 437/313 |
| 5,142,438 | 8/1992 | Reinberg et al. | 437/52 |

FOREIGN PATENT DOCUMENTS

| 0380326 | 8/1990 | European Pat. Off. |
| 0448151 | 9/1991 | European Pat. Off. |
| 0000163 | 1/1983 | Japan |
| 0213148 | 9/1987 | Japan |
| 0187061 | 7/1990 | Japan |
| 2120849 | 12/1983 | United Kingdom |

Primary Examiner—Tom Thomas
Attorney, Agent, or Firm—Mark J. Murphy; Edward D. Manzo

[57] ABSTRACT

A method for forming a ferroelectric capacitor for use an integrated circuit establishing one layer over another and then annealing the structure, using an oxygen or ozone anneal, after each layer is established. In particular, an ozone anneal is used after the establishment of a layer of ferroelectric material.

25 Claims, 4 Drawing Sheets

5,374,578

OZONE GAS PROCESSING FOR FERROELECTRIC MEMORY CIRCUITS

This is a continuation of application Ser. No. 07/841,370, filed Feb. 25, 1992 now abandoned.

BACKGROUND OF THE INVENTION

The present invention is directed to a method for forming ferroelectric integrated circuits and, in particular, ferroelectric capacitors.

Ferroelectric capacitors are typically formed through a series of deposition and defining steps. The process requires that several oxygen anneals be done. Oxygen anneals are required in order to form correct crystal phases of deposited sputtered or spun-on "PZT" and to reduce electrode and material deficiencies.

"PZT" is the name for a ferroelectric material comprising lead zirconate titanate and having the general formula $Pb(Ti_xZr_{1-x})O_3$ wherein $x=0$ to 1. As deposited, sputtered, or spun-on PZT is amorphous and has no (or insufficient) ferroelectric properties. Annealing in oxygen is necessary to form the correct crystallographic phases that produce the desired ferroelectric properties. For example, when PZT is used in memory circuits, the desired ferroelectric phase is a tetragonal phase. One of the desired ferroelectric characteristics is then a permanent dipole moment without an applied electric field. This can only occur if there is a unilateral displacement of the positively charged $Ti^{+4}$ ion against its negatively charged $O^{-2}$ surroundings. Oxygen vacancies are quite likely to occur in the sputtered PZT material due to target imperfections and due to oxygen reactivity. Thus, oxygen is needed to repair these defects and ensure good ferroelectric behavior. These oxygen anneals also condition the electrode/PZT interface by acting as an electrical acceptor atom that helps reduce the excess charges at the interface that are generated as a result of material lattice mismatch.

Currently, oxygen anneals are done in an $O_2$ ambient at a temperature greater than 500° C. Typically, the oxygen anneal is done using a furnace anneal or rapid thermal annealing process (RTA).

Unfortunately, the effect of these anneals can be reduced, or even eliminated, by some of the other processing steps used to form the ferroelectric capacitor. For example, many of the subsequent integrated circuit processing steps involve low pressure, weakly ionized and highly energetic gas conditions (known as plasmas). Medium energy (<1 keV) electrons and photons are produced in these plasmas. These particles can ionize in the ferroelectric material to form electron/hole pairs or can ionize constituent PZT atoms. This extra charge produced as a result of these processes can accumulate to form internal electric fields larger than and/or in opposite directions to that of the induced structure dipole moment in the ferroelectric material.

For example, a $SiH_4$ glass deposition step can result in the $H_2$ or $N_2$ becoming substitutional impurities in the ferroelectric crystal which can destroy the crystal's ferroelectric effect. If sufficient $H_2$ is accumulated substitutionally in the ferroelectric crystal, the induced structural dipole moment reduces to zero, and the ferroelectric hysteresis curve collapses to that of a conventional linear dielectric medium. This could be interpreted as a region of greatly reduced resistivity embedded in the ferroelectric material.

The object of the present invention is to provide an improved method for forming a ferroelectric capacitor which does not suffer from the drawbacks described above.

SUMMARY OF THE INVENTION

The present invention is directed to a method for forming a ferroelectric capacitor using ozone anneals. In general, the method comprises a series of processing steps, including a series of ozone anneals.

Ozone anneals provide a more complete method of supplying oxygen to the ferroelectric material than oxygen anneals since ozone quickly decays to $O_2$ and $O^-$ at temperatures above 400° C. As a result of this decay, not only is $O_2$ provided to the ferroelectric material, but also the highly reactive $O^-$ species which has a higher electron affinity than $O_2$ is provided. Further, since ozone gas is highly reactive and naturally tries to become stable by giving up an oxygen, ozone is not limited by the same surface adsorption/desorption kinetics as regular $O_2$. In other words, whereas an oxygen molecule must be adsorbed at the surface of a ferroelectric material at 500° C. and sufficient energy applied to break the covalent bond, the ozone molecule decomposes into an oxygen atom and oxygen molecule in a few milliseconds at 500° C. or above. As a result, when a ferroelectric material is exposed to ozone, the ferroelectric material can obtain an oxygen atom much quicker than it can obtain one from $O_2$. Accordingly, ozone can provide a higher concentration of reactive oxygen atoms for diffusion into the ferroelectric material which results in a relatively faster diffusion (penetration) of oxygen into the ferroelectric material. This is important in that the faster oxygen is provided to the ferroelectric crystal, the fewer the number of lead (Pb) atoms that will be lost.

BRIEF DESCRIPTION OF THE DRAWINGS

In describing the preferred embodiment, reference is made to the accompanying drawings wherein like parts have like reference numerals, and wherein.

DETAILED DESCRIPTION OF THE PRESENTLY PREFERRED EMBODIMENT

The preferred embodiment of the present invention in its method aspects comprises a series of fabrication steps which are carried out in the manner set forth below.

Figure 1:
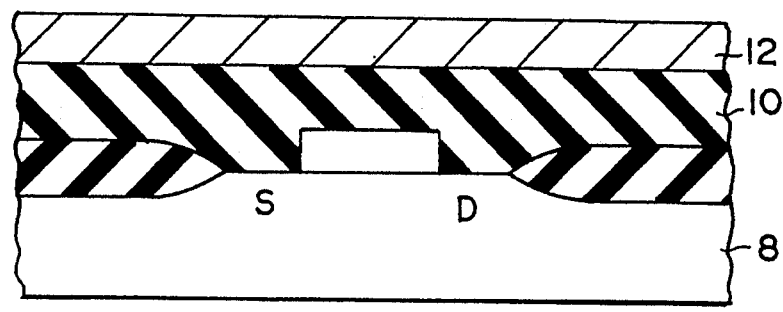
FIG. 1 is a cross-sectional view of a portion of a ferroelectric circuit, according to an embodiment of the present invention, having a bottom electrode over a flowed glass layer.

In FIG. 1, in accordance with the present invention, a bottom electrode 12 is established over a flowed glass layer 10. Flowed glass layer 10 provides an isolation between the doped polysilicon gate 9, substrate 8 (Si or any compound semiconductor like GaAs) and the subsequent interconnect layers. Source and drain regions (S,D) are also shown. Bottom electrode 12 can be established by sputter deposition or by evaporation, for example.

In another embodiment, the bottom electrode can be directly formed in an active region, such as the source or drain region, of the substrate.

Bottom electrode 12 can comprise a noble metal, such as platinum (Pt), gold (Au), or a molybdenum (Mo), for example. Preferably, bottom electrode 12 comprises a 200Å (20 nm) titanium (Ti) layer and a 1,500Å (150 nm) platinum (Pt) layer deposited in a single pass without breaking vacuum between the two metal depositions. The Ti layer is used as a glue layer since adhesion of the Pt to the flowed glass is typically poor.

A preliminary anneal is then performed to anneal bottom electrode 12 by either furnace annealing or rapid thermal annealing (RTA) in either oxygen, ozone, air, or forming gas at a temperature between 500° C. to 700° C. The anneal causes the formation of a few monolayers of $TiO_2$ which provides a better adhesion between the bottom electrode and the flowed glass. Further, the anneal places some $TiO_2$ (if oxygen is used during annealing) or TiN islands (if air and/or forming gases are used during annealing) on top of the Pt film. This improves the adhesion between the bottom electrode and the subsequently deposited ferroelectric material.

Figure 2:
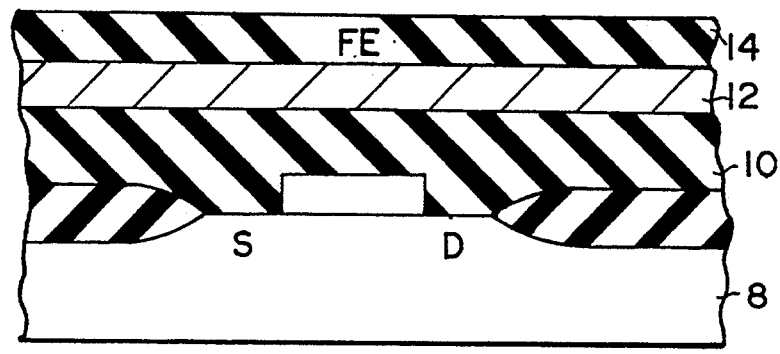
FIG. 2 shows the structure of FIG. 1 with a layer of ferroelectric material over the bottom electrode.

A layer of ferroelectric material 14 is then established over bottom electrode 12, as shown in FIG. 2. Any material of the perovskite crystal type or of a high dielectric constant, for example tantalum oxides, can be deposited as ferroelectric material 14. For example, any material having the general formula $A_xB_yO_z$, wherein typically z is 3, could be utilized as ferroelectric material 14. Included within this group is the class of high temperature superconductors of perovskite crystal such as $YBa_2Cu_3O_7$, for example. Preferably, however, the ferroelectric material is either PZT having a general formula of $Pb(Ti_xZ_{1-x})O_3$ or a doped PZT such as PLZT, for example. Ferroelectric material 14 can be established by deposition, for example, either by RF sputtering from a PZT oxide ceramic target in argon and/or oxygen or ozone, or by DC/RF sputtering from a (Pb—Ti—Zr) metal target in argon/oxygen/ozone atmosphere. In the alternative, ferroelectric material 14 can be deposited by spinning the pre-cursers of Pb—Ti—Zr oxides suspended in organic solvents at a high rpm and then annealing to remove the organic solvents.

A first anneal is then performed on ferroelectric material 14. This first anneal is in an ozone atmosphere using a rapid thermal anneal process (RTA) or a furnace anneal. If a furnace anneal or RTA is used to anneal the entire wafer, on which the ferroelectric material resides, lasers, microwaves or gas discharges (plasmas) can be used to perform the annealing. In the preferred embodiment, the anneal is done using RTA since the use of RTA provides better ferroelectric performance in a memory ferroelectric capacitor.

In a RTA process, the wafer is subjected to a very quick ramp-up of temperature by using heat radiation from a bank of tungsten halogen lamps. The wafer is housed in a quartz cage and the temperature of the wafer is controlled by using a thermocouple and/or an optical pyrometer. Gases like oxygen, ozone or air can be used in the annealing process. When using RTA, the anneal is preferably conducted at a temperature in the range of about 650° C. to about 850° C. for about five to thirty seconds. Ozone gas is preferred during the rapid thermal annealing of ferroelectric layer 14 in order to accomplish the conversion of the micro-crystalline phase of the PZT to a perovskite crystal phase which exhibits ferroelectric behavior. In addition, an RTA in ozone is preferred in that it significantly decreases the number of lead (Pb) atoms lost during annealing as compared to using a conventional oxygen anneal in a furnace.

This first anneal can be conducted using either a single anneal or a combination of anneals. The anneal can be done using a RTA or furnace anneal with $O_2$ and/or $O_3$ gas at any pressure over the Curie point of the ferroelectric material. Possible combinations include an ozone RTA followed by an oxygen RTA, an ozone RTA followed by an oxygen furnace anneal, an oxygen furnace anneal followed by an ozone RTA, or an ozone furnace anneal followed by an oxygen furnace anneal, which can be done in a single furnace or two different furnaces. The type of anneal utilized is based on the ferroelectric characteristic desired at the end of the fabrication steps. In the preferred embodiment, either an ozone RTA followed by a oxygen furnace anneal or a oxygen furnace anneal followed by an ozone RTA, is utilized.

Figure 3:
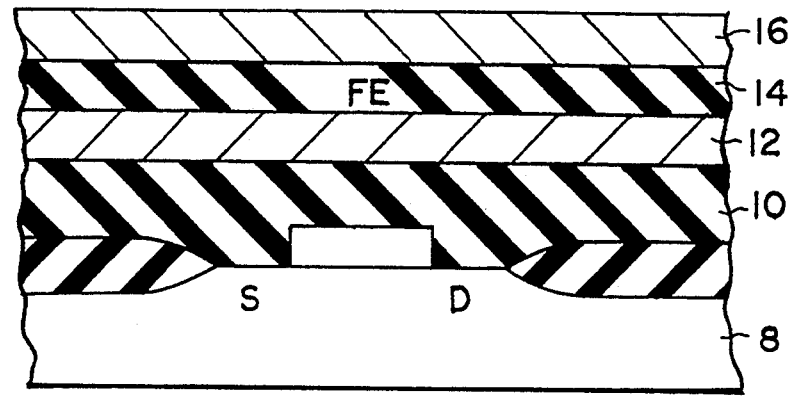
FIG. 3 shows the structure of FIG. 2 with a top electrode over the layer of ferroelectric material.

As shown in FIG. 3, a top electrode 16 is then established by, for example, deposition by DC magnetron sputtering over ferroelectric material 14. Top electrode 16 can be comprised of a noble metal, for example platinum, gold, or molybdenum. Electrode 16 has a preferred thickness of approximately 1,500Å (150 nm).

Figure 4:
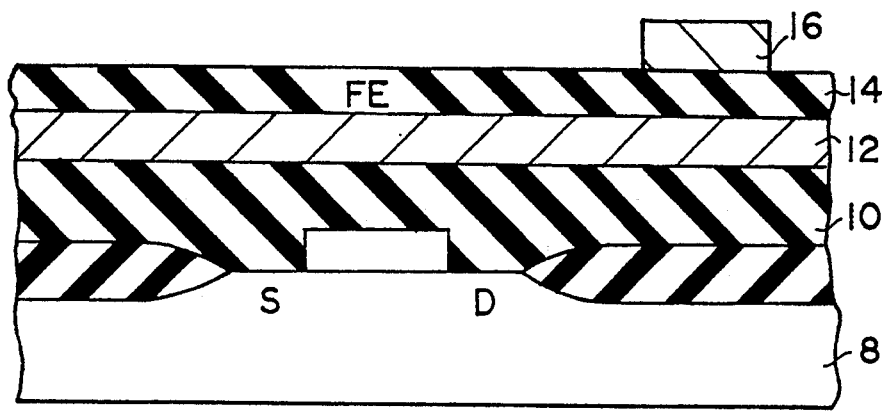
FIG. 4 shows the structure of FIG. 3 with a portion of the top electrode removed.

A first photoresist pattern is then established over top electrode 16. The first photoresist pattern can be established by optical lithography, for example. Top electrode 16 is then patterned or defined. Electrode 16 can be defined by using an anisotropic reactive ion etch using a Freon-12 plasma, for example. Ion-milling or sputter etching (using a hard metal mask such as TiW) in argon could also be used to define top electrode 16. The first photoresist pattern is then removed. The resulting structure is shown in FIG. 4.

A second anneal, annealing the entire stack (12, 14, 16), is performed. This anneal can be done using either a furnace anneal or RTA. For a memory circuit, a furnace anneal at a temperature between 650° C. and 750° C. in oxygen for one hour is preferred. However, an ozone RTA at a temperature higher than 750° C. for 45 seconds, followed by an oxygen anneal in furnace at 750° C. for one hour could also be used. In addition, pre-exposing the entire wafer to ozone at a temperature above 450° C. for 30 minutes prior to this second anneal improves the ferroelectric characteristics achieved with this anneal.

Figure 5:
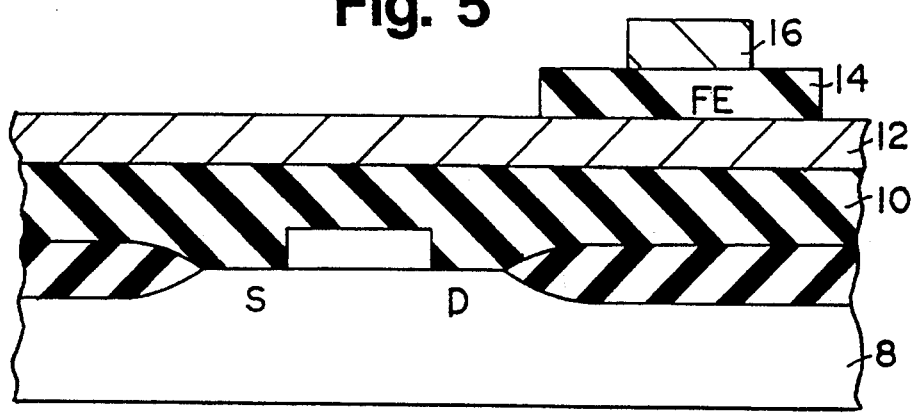
FIG. 5 shows the structure of FIG. 4 with a portion of the ferroelectric material removed.

Next, a second photoresist pattern is established by conventional means over ferroelectric material 14 and top electrode 16 in order to pattern or define ferroelectric material 14. Ferroelectric material 14 is then patterned by optical lithography, for example. The exposed ferroelectric material is etched, and then the photoresist pattern is removed to yield the structure of FIG. 5.

Figure 6:
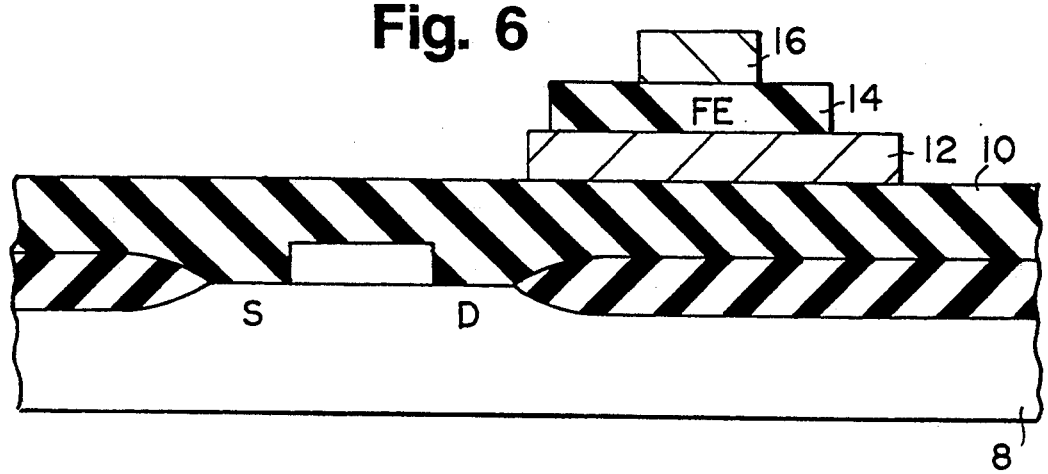
FIG. 6 shows the structure of FIG. 5 with a portion of the bottom electrode removed.

Next, a third photoresist pattern is established by conventional means to define the area of bottom electrode 12. Bottom electrode 12 is then optically patterned, and then etched to remove the exposed portion of the bottom electrode. The third photoresist is then removed. FIG. 6 shows the resulting structure.

A third anneal is then performed. This anneal can be by either a furnace anneal at 550° C. in oxygen for one hour or a two-step process involving exposing the structure to ozone for 30 minutes at a temperature between 400°–450° C. and then performing a furnace anneal at 550° C. in oxygen for one hour.

Figure 7:
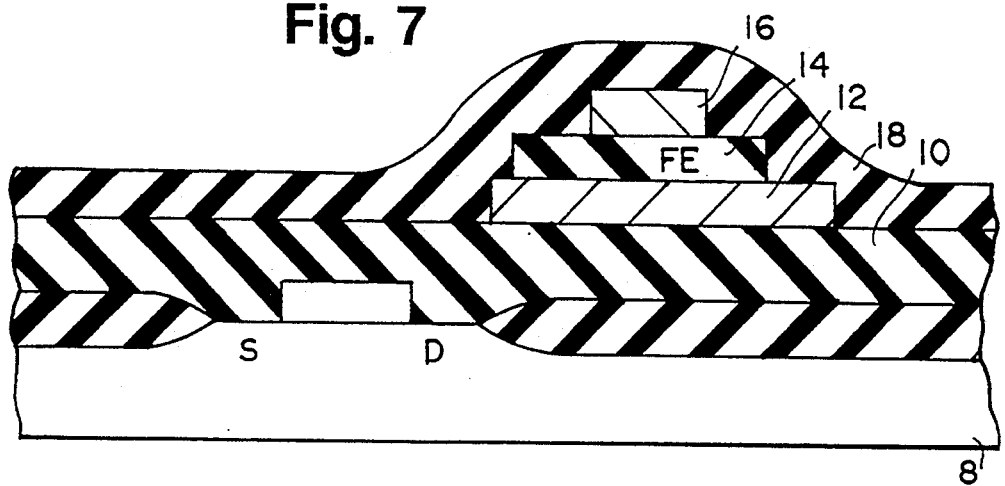
FIG. 7 shows the structure of FIG. 6 with a layer of glass over the top electrode, the ferroelectric material and the bottom electrode.

A glass 18 is then established over the wafer, as shown in FIG. 7. Glass 18 could be deposited in many ways. Examples include chemical vapor deposition (CVD) with TEOS (Tetra-Ethyl Ortho-Silicate) and oxygen at 600° C. or higher, CVD with $SiH_4$ and $O_2$ at 380° C. or higher, PECVD (Plasma Enhanced CVD) using TEOS and oxygen at 390° C., or by "Thermal" CVD of TEOS with ozone at 390° C. The use of ozone in the ambient for depositing glass helps in reducing the degradation of the ferroelectric material underneath. The preferred glass film stack consists of a thermal CVD $O_3$/TEOS glass followed by a PECVD TEOS-/$O_2$ glass. Glass 18 has a thickness of approximately 5,000Å (500 nm).

A first contact window 20 to top electrode 16 is then established by etching. Preferably, first contact window 20 is established by plasma etching through glass 18 using a photoresist contact mask. In addition, a second contact window 22 to bottom electrode 12 is also established through glass 18. Preferably, both contact windows 20, 22 are established at the same time.

Figure 8:
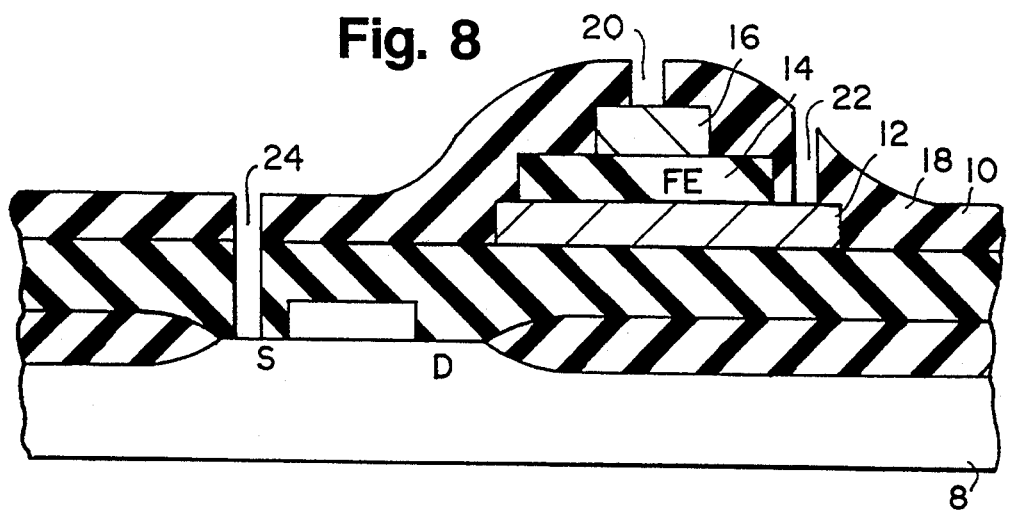
FIG. 8 shows the structure of FIG. 7 with contact windows defined in the glass to the top electrode, the bottom electrode and the substrate.

A fourth anneal is then performed. The fourth anneal can be performed in a manner similar to that described previously for the third anneal. After the fourth anneal, a contact window 24 is etched through glass 18 and flowed glass layer 10 to substrate 8. FIG. 8 shows the resulting structure.

Figure 9:
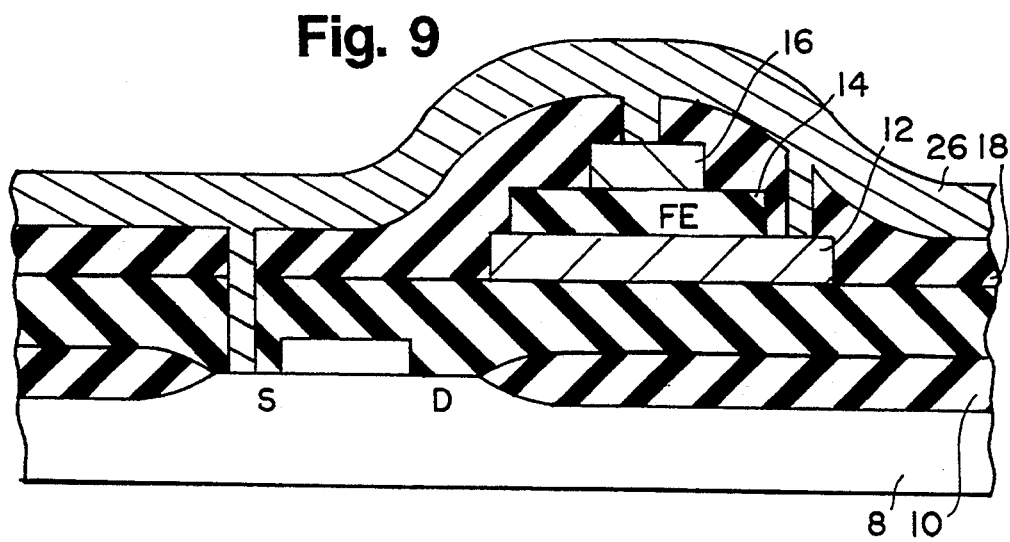
FIG. 9 shows the structure of FIG. 8 with a metal interconnect layer over the layer of glass.

Next, a metal interconnect 26 is established by sputter deposition, for example, over glass 18 and in contact windows (20, 22, 24), as shown in FIG. 9. Interconnect 26 can comprise a TiN barrier plus an Al—Si metal, such as aluminum doped with a 1% Si for example. The Al—Si metal can be sputter deposited over the underlying sputtered TiN barrier. The barrier prevents the Al—Si metal from interdiffusing with the top and bottom electrodes during subsequent anneals. The thickness of the TiN barrier is approximately 500Å (50 nm), and the thickness of the Al—Si metal is between 5,000Å (500 nm) and 8,000Å (800 nm).

Figure 10:
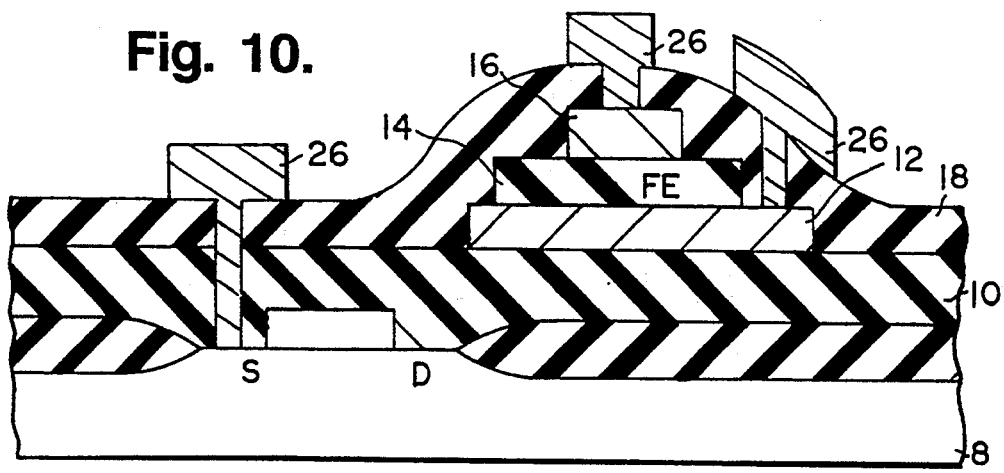
FIG. 10 shows a structure of FIG. 9 with a portion of the interconnect layer removed.

A fourth photoresist pattern is then established by conventional means over metal interconnect 26. The exposed metal interconnect layer is then etched, and the fourth photoresist pattern is removed to yield the structure of FIG. 10.

A fifth anneal in ozone and/or oxygen is then performed. The fifth anneal is done by furnace annealing or RTA. Preferably, a furnace anneal is done at a temperature of less than 450° C. and for no more than 30 minutes.

Figure 11:
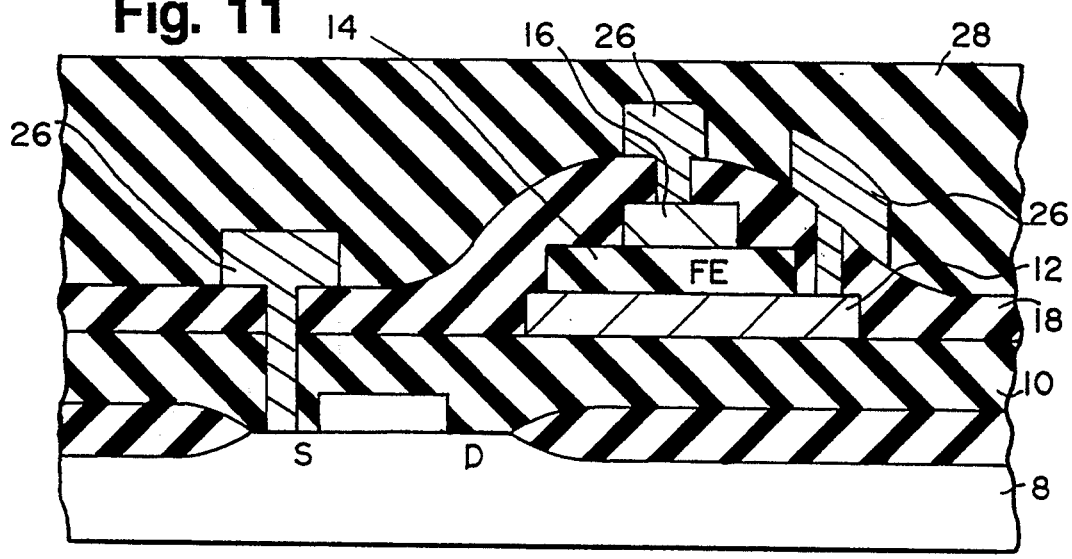
FIG. 11 shows the structure of FIG. 10 with an intermetal dielectric.
Figure 12:
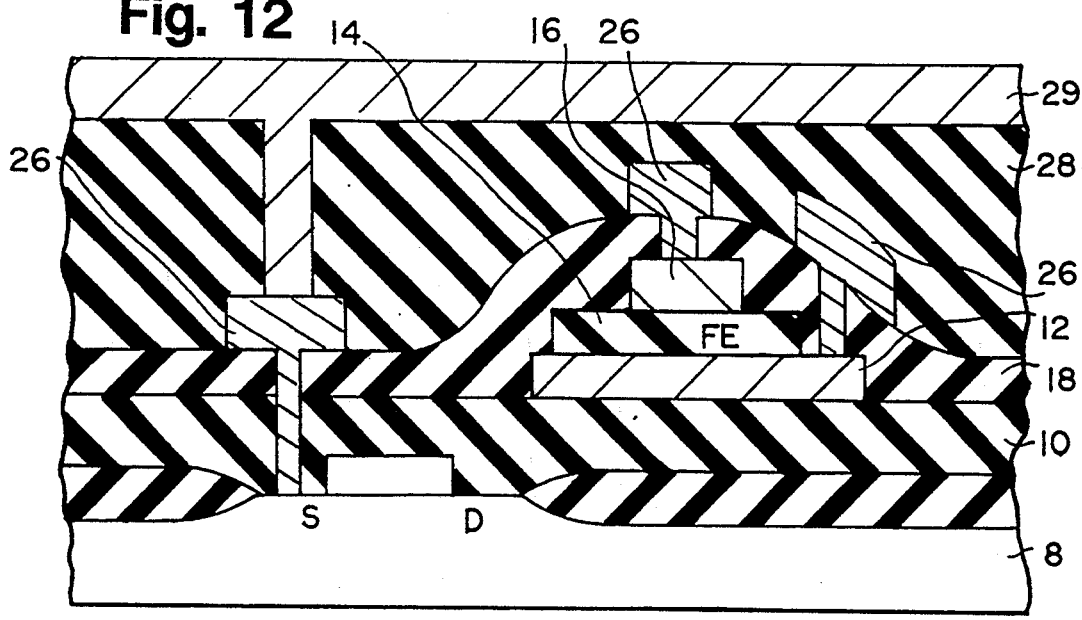
FIG. 12 shown the structure of FIG. 11 with a second outed interconnect.

A planarized intermetal dielectric 28 can then be established as shown in FIG. 11. Intermetal dielectric 28 can be a sandwich of plasma enhanced chemical vapor deposition of $SiH_4$ and $N_2O$ (PECVD oxide)/Spin-On-Glass (SOG)/PECVD oxide or PECVD oxide/Atmospheric Pressure CVD (APCVD) TEOS-$O_3$/PECVD oxide for example. A fifth photoresist pattern is then established by conventional means over the intermetal dielectric 28. The exposed intermetal dielectric 28 can then be etched to form contacts (vias) to the first interconnect metal 26. The fifth photoresist pattern is removed to yield the structure of FIG. 12. A second interconnect metal 29, is established over dielectric 28 and can be % Si comprised of Al-1%Si or Al-1% Si-0.5% Cu, for example. Barrier layers, such as TiN or TiW, for example, can be deposited under second metal interconnect 29, if desired.

A sixth anneal in ozone and/or oxygen is then performed to complete the structure of the present invention. The sixth anneal is performed in a manner similar to that described for the fifth anneal.

The process-steps of intermetal dielectric deposition, via formation and interconnect metal depositions could be repeated to create higher levels of multi-level interconnect layers, as needed.

This description has been offered for illustrative purposes only and is not intended to limit the invention of this application, which is defined in the claims below.

We claim:

1. A method for forming a ferroelectric memory circuit comprising the steps of:
    establishing a bottom electrode structure on a substrate;
    establishing a layer of ferroelectric material over said bottom electrode structure;
    performing a first anneal on said layer of ferroelectric material, said first anneal being an ozone anneal;
    establishing a top electrode layer over said layer of ferroelectric material:
    patterning said top electrode layer to form a patterned top electrode;
    performing a second anneal on said patterned top electrode, said layer of ferroelectric material and said bottom electrode structure:
    patterning said layer of ferroelectric material to form a patterned ferroelectric material:
    patterning said bottom electrode structure to form a patterned bottom electrode;
    performing a third anneal on said patterned top electrode, said patterned ferroelectric material and said patterned bottom electrode;
    establishing a layer of glass over said patterned top electrode, said patterned ferroelectric material and said patterned bottom electrode;
    opening contact windows in said layer of glass to said patterned top electrode and said patterned bottom electrode;
    performing a fourth anneal on said layer of glass, said patterned top electrode, said patterned ferroelectric material and said patterned bottom electrode;
    defining another contact window in said layer of glass to said substrate;
    establishing a metal interconnect layer over said layer of glass and in said contact windows;
    patterning said metal interconnect layer to form a patterned metal interconnect; and
    performing a fifth anneal on said patterned metal interconnect, said layer of glass, said patterned top electrode, said patterned ferroelectric material and said patterned bottom electrode.

2. The method of claim 1 further comprising the steps of establishing an inter-metal dielectric over said patterned metal interconnect and said layer of glass and performing a sixth anneal on said inter-metal dielectric, said patterned metal interconnect, said layer of glass, said patterned top electrode, said patterned ferroelectric material and said patterned bottom electrode.

3. The method of claim 1 wherein said first anneal is done by a rapid thermal annealing process.

4. The method of claim 3 wherein said rapid thermal annealing process is done at a temperature in the range of 650° C. to 850° C. for a period of between 5 and 30 seconds.

5. The method of claim 1 wherein said first anneal is a combination of two anneals, one first anneal being an ozone rapid thermal anneal and another said first anneal being an oxygen furnace anneal.

6. The method of claim 1 wherein said first anneal is a combination of two anneals, one first anneal being an ozone furnace anneal and another said first anneal being an oxygen rapid thermal anneal.

7. The method of claim 1 wherein said second anneal is a furnace anneal.

8. The method of claim 7 wherein said furnace anneal is at a temperature of between 650° C. and 750° C. in oxygen for approximately one hour.

9. The method of claim 1 wherein said second anneal is a rapid thermal anneal in ozone at a temperature over 750° C. followed by a furnace anneal at 750° C. for approximately one hour.

10. The method of claim 1 wherein said third anneal is a furnace anneal at a temperature in the range of 450° C. to 750° C. in oxygen for approximately one hour.

11. The method of claim 1 further comprising the step of exposing the patterned top electrode, the patterned ferroelectric material and the patterned bottom electrode to ozone at a temperature of between 400° C. to 450° C. for approximately 30 minutes prior to performing the third anneal.

12. The method of claim 1 wherein said fourth anneal is a furnace anneal at a temperature of about 550° C. in oxygen for approximately one hour.

13. The method of claim 1 further comprising the step of exposing the patterned top electrode, the patterned ferroelectric material and the patterned bottom electrode to ozone at a temperature of between 400° C. and 450° C. for approximately 30 minutes prior to performing the fourth anneal.

14. The method of claim 1 wherein said fifth anneal is a furnace anneal at a temperature of about 550° C. in oxygen for approximately one hour.

15. The method of claim 1 further comprising the step of exposing the patterned top electrode, the patterned ferroelectric material and the patterned bottom electrode to ozone at a temperature of between 400° C. to 450° C. for approximately 30 minutes prior to performing the fifth anneal.

16. The method of claim 2 wherein said sixth anneal is a furnace anneal.

17. The method of claim 16 wherein said furnace anneal is at a temperature of less than 450° C. for no more than 30 minutes.

18. The method of claim 1 further comprising the step of performing a preliminary anneal of the bottom electrode structure by a furnace anneal or a rapid thermal anneal prior to the step of establishing the layer of ferroelectric material.

19. A method for forming a ferroelectric capacitor comprising the steps of:
  establishing a bottom electrode structure;
  establishing a layer of ferroelectric material over said bottom electrode structure;
  performing a first anneal on said layer of ferroelectric material, said first anneal being an ozone anneal;
  establishing a top electrode layer over said layer of ferroelectric material and patterning said top electrode layer to form a patterned top electrode; and
  performing a second ozone anneal on said patterned top electrode, said layer of ferroelectric material and said bottom electrode structure.

20. The method of claim 19 wherein said first anneal is performed after establishing the layer of ferroelectric material and before establishing the top electrode layer.

21. A method of forming a ferroelectric memory circuit comprising the steps of:
  establishing a bottom electrode structure in an active region of a substrate;
  establishing a layer of ferroelectric material over said bottom electrode Structure;
  performing a first anneal on said layer of ferroelectric material, said first anneal being an ozone anneal;
  establishing a top electrode layer over said layer of ferroelectric material;
  patterning said top electrode layer to form a patterned top electrode;
  performing a second anneal on said patterned top electrode, said patterned ferroelectric material and said bottom electrode structure;
  patterning said layer of ferroelectric material to form a patterned ferroelectric material:
  patterning said bottom electrode Structure to form a patterned bottom electrode;
  performing a third anneal on said patterned top electrode, said patterned material and said patterned bottom electrode;
  establishing a layer of glass over said patterned top electrode, said patterned ferroelectric material and said patterned bottom electrode;
  defining contact windows in said layer of glass to said patterned top electrode and said patterned bottom electrode;
  performing a fourth anneal on said layer of glass, said patterned top electrode, said patterned ferroelectric material and said patterned bottom electrode;
  defining another contact window in said layer of glass to said substrate;
  establishing a metal interconnect layer over said layer of glass and in said contact windows;
  patterning said metal interconnect layer to form a patterned metal interconnect; and
  performing a fifth anneal on said metal interconnect, On said layer of glass, said patterned top electrode, said patterned ferroelectric material and said patterned bottom electrode.

22. A method of forming a ferroelectric memory structure comprising the steps of:
  establishing a bottom electrode structure, a layer of ferroelectric material thereover, and a top electrode layer over said layer of ferroelectric material;
  patterning said bottom electrode structure, said layer of ferroelectric material, and said top electrode layer to form a patterned top electrode, a patterned ferroelectric material and a patterned bottom electrode;

establishing a dielectric layer over said patterned top electrode, said patterned ferroelectric material, and said patterned bottom electrode, opening at least one contact window in said dielectric layer, and establishing an electrically conductive interconnect layer over said dielectric layer and in said contact window for making electrical connection to one or more of said electrodes;

performing a series of anneal steps during said preceding anneal steps being an ozone anneal after said layer of ferroelectric material is established over said bottom electrode structure;

wherein at least one of said anneal steps comprises separately performing an anneal in ozone and performing an anneal in oxygen.

23. The method of claim 22 wherein said oxygen anneal step follows said ozone anneal step.

24. A method of forming a ferroelectric memory structure comprising the steps of:

establishing a bottom electrode structure, a layer of ferroelectric material thereover, and a top electrode layer over said layer of ferroelectric material;

patterning said bottom electrode structure, said layer said top electrode layer to form a patterned top electrode, a patterned ferroelectric material and a patterned bottom electrode;

establishing a dielectric layer over said patterned top electrode, said patterned ferroelectric material, and said patterned bottom electrode, opening at least one contact window in said dielectric layer, and establishing an electrically conductive interconnect layer over said dielectric layer and in said contact window for making electrical connection to one or more of said electrodes;

performing a series of anneal steps during said preceding steps, at least one of said anneal steps being an ozone anneal after said layer of ferroelectric material is established over said bottom electrode structure;

wherein at least one of said anneal steps comprises exposing the ferroelectric memory structure to an ozone atmosphere at a temperature in the range substantially of 400° to 450° C. and then performing a furnace anneal in oxygen.

25. A method for forming a ferroelectric memory circuit comprising the steps of:

(1) forming a bottom electrode structure on a substrate;

(2) depositing a layer of ferroelectric material over said bottom electrode structure;

(3) performing a first anneal on said layer of ferroelectric material, said first anneal being an ozone anneal;

(4) depositing a top electrode layer over said layer of ferroelectric material;

(5) depositing a first photoresist pattern over said top electrode layer;

(6) removing a portion of said top electrode layer not covered by said first photoresist pattern to form a patterned top electrode;

(7) removing said first photoresist pattern;

(8) performing a second anneal on said patterned top electrode, said layer of ferroelectric material and said bottom electrode structure;

(9) depositing a second photoresist pattern over said patterned top electrode and said layer of ferroelectric material;

(10) removing a portion of said layer of ferroelectric material not covered by said second photoresist pattern to form a patterned ferroelectric material;

(11) removing said second photoresist pattern;

(12) depositing a third photoresist pattern over said patterned top electrode, said patterned ferroelectric material and said bottom electrode structure;

(13) removing a portion of said bottom electrode structure not covered by said third photoresist pattern to form a patterned bottom electrode;

(15) removing said third photoresist pattern;

(16) performing a third anneal on said patterned top electrode, said patterned ferroelectric material and said patterned bottom electrode;

(17) depositing a layer of glass over said patterned top electrode, said patterned ferroelectric material and said patterned bottom electrode;

(18) opening respective contact windows in said layer of glass to said patterned top electrode and said patterned bottom electrode;

(19) performing a fourth anneal on said patterned top electrode, said patterned of ferroelectric material and said patterned bottom electrode;

(20) opening another contact window in said layer of glass to said substrate;

(21) depositing a metal interconnect layer over said layer of glass and in said contact windows;

(22) depositing a fourth photoresist pattern over said metal interconnect layer;

(23) removing a portion of said metal interconnect layer to form a patterned metal interconnect;

(24) removing said fourth photoresist pattern; and

(25) performing a fifth anneal on said patterned metal interconnect, said layer of glass, said patterned top electrode, said patterned ferroelectric material and said patterned bottom electrode.

* * * * *